（12） United States Patent
Guan et al.

(10) Patent No.: US 12,062,683 B2
(45) Date of Patent: Aug. 13, 2024

(54) LIGHT PANEL AND DISPLAY DEVICE

(71) Applicant: BOE Technology Group Co., Ltd., Beijing (CN)

(72) Inventors: Enhui Guan, Beijing (CN); Xiao Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 563 days.

(21) Appl. No.: 17/359,613

(22) Filed: Jun. 27, 2021

(65) Prior Publication Data
US 2021/0408110 A1 Dec. 30, 2021

(30) Foreign Application Priority Data

Jun. 30, 2020 (CN) .......................... 202021257675.1

(51) Int. Cl.
*H01L 27/15* (2006.01)
*G09G 3/32* (2016.01)
*H01L 33/48* (2010.01)

(52) U.S. Cl.
CPC ............. *H01L 27/156* (2013.01); *G09G 3/32* (2013.01); *H01L 33/486* (2013.01)

(58) Field of Classification Search
CPC . H01L 27/156; H01L 33/486; H01L 25/0753; H01L 25/167; G09G 3/32
See application file for complete search history.

(56) References Cited

U.S. PATENT DOCUMENTS

| | | | |
|---|---|---|---|
| 10,483,253 B1* | 11/2019 | Hu | H01L 25/50 |
| 2019/0107271 A1 | 4/2019 | Lin | |
| 2020/0310052 A1* | 10/2020 | Lim | H01L 21/56 |
| 2020/0312231 A1* | 10/2020 | Hussell | G09G 3/32 |

FOREIGN PATENT DOCUMENTS

| | | |
|---|---|---|
| CN | 203800046 U | 8/2014 |
| CN | 104167412 A | 11/2014 |
| CN | 104979326 A | 10/2015 |
| CN | 110391261 A | 10/2019 |
| CN | 209880656 U | 12/2019 |
| JP | 2006344564 A | 12/2006 |

* cited by examiner

*Primary Examiner* — Jonathan Han
(74) *Attorney, Agent, or Firm* — IPro, PLLC

(57) ABSTRACT

A light panel, includes: a printed circuit board (PCB); a light emitting element array, comprising a plurality of light emitting elements disposed on a first surface of the PCB and arranged in an array in a first direction and in a second direction; and a driving chip, disposed on a second surface of the PCB, which is opposite to the first surface; wherein the light-emitting element array comprises a light-emitting element sub-array, and orthographic projections of at least portion of light-emitting elements of the light-emitting element sub-array on the PCB are located outside an orthographic projection of the driving chip on the PCB. A display device is further provided.

20 Claims, 5 Drawing Sheets

LIGHT PANEL AND DISPLAY DEVICE

CROSS REFERENCES TO RELATED APPLICATIONS

This disclosure claims the priority of a Chinese patent application filed with the National Intellectual Property Administration, P. R. C., under CN 202021257675.1, entitled "Light Panel and Display Device" on Jun. 30, 2020, the entire contents of which are incorporated by reference in this disclosure.

TECHNICAL FIELD

Embodiments of the present disclosure relates to a light panel and a display device.

BACKGROUND

In related technologies, a mini LED (small light emitting diode) can be used as a backlight source for a liquid crystal display (LCD) system. If a backlight source and a driving chip are integrated in a backlight assembly, that is, mini LEDs and a driving chip are disposed on each side of a printed circuit board respectively, in a case that there are a large quantity of mini LEDs, heat dissipation requirement of the entire backlight assembly gets higher. Therefore, how to reduce the influence of mini LED heating on the driving chip is a technical problem concerned.

SUMMARY

At least one embodiment of the present disclosure provides a light panel, including:
  a printed circuit board (PCB);
  a light emitting element array, including a plurality of light emitting elements disposed on a first surface of the PCB and arranged in an array in a first direction and in a second direction; and
  a driving chip, disposed on a second surface of the PCB, which is opposite to the first surface;
  wherein the light-emitting element array includes a light-emitting element sub-array, and an orthographic projection of at least portion of light-emitting elements of the light-emitting element sub-array on the PCB is located outside an orthographic projection of the driving chip on the PCB.

In an embodiment of the present disclosure, the light-emitting element sub-array includes N*N light-emitting elements among the plurality of light-emitting elements, and both the numbers of light-emitting elements of the light-emitting element sub-arrays arranged in the first direction and in the second direction are N, and a distance between two adjacent light-emitting elements of the light-emitting element sub-array and a distance between two adjacent light-emitting elements of the light-emitting element array are same; and the driving chip has a square shape.

In an embodiment of the present disclosure, a side length of the driving chip is twice the distance between two adjacent light-emitting elements, the distance between two adjacent light-emitting elements ranges from 2.5 mm to 5 mm, and N is 3; an orthographic projection of a light-emitting element at a vertex of the light-emitting element sub-array on the PCB is located outside an orthographic projection of the driving chip on the PCB; and an orthographic projection of a light-emitting element at a center of the light-emitting element sub-array on the PCB is located within the orthographic projection of the driving chip on the PCB.

In an embodiment of the present disclosure, an orthographic projection of the light-emitting elements of the light-emitting element sub-array on the PCB and an orthographic projection of diagonal lines of the driving chip on the PCB satisfy at least one of following: an orthographic projection of light emitting elements in a second row in the first direction on the PCB is located on an orthographic projection of a first diagonal line of the driving chip on the PCB, wherein the first diagonal line extends in the second direction; and an orthographic projection of light-emitting elements in a second row in the second direction on the PCB is located on an orthographic projection of a second diagonal of the driving chip on the PCB, wherein the second diagonal extends in the first direction.

In an embodiment of the present disclosure, the orthographic projection of the light-emitting element at the center of the light-emitting element sub-array on the PCB coincides with an orthographic projection of a center of the driving chip on the PCB.

In an embodiment of the present disclosure, the distance between two adjacent light-emitting elements ranges from 3.5 mm to 7 mm; a side length of the driving chip is greater than 1.2 times the distance between two adjacent light-emitting elements and is less than twice the distance between two adjacent light-emitting elements, N is 3; and only an orthographic projection of a light-emitting element at a center of the light-emitting element sub-array on the PCB is located within the orthographic projection of the driving chip on the PCB.

In an embodiment of the present disclosure, an orthographic projection of the light-emitting elements of the light-emitting element sub-array on the PCB and an orthographic projection of a central axis of the driving chip on the PCB satisfy at least one of following: an orthographic projection of the second row of light emitting elements in the first direction on the PCB is located on an orthographic projection of a first central axis of the driving chip on the PCB, wherein the first central axis extending in the second direction; and an orthographic projection of the second row of light second row of light-emitting elements in the second direction on the PCB is located on an orthographic projection of a second central axis of the driving chip on the PCB, wherein the second central axis extending in the first direction.

In an embodiment of the present disclosure, the orthographic projection of the light-emitting element at the center of the light-emitting element sub-array on the PCB coincides with an orthographic projection of a center of the driving chip on the PCB.

In an embodiment of the present disclosure, the distance between two adjacent light-emitting elements ranges from 7 mm to 14 mm, and a side length of the driving chip is less than or equal to 1.15 times the distance between the two adjacent light-emitting elements, N is 2; and orthographic projections of all the light-emitting elements of the light-emitting element sub-array on the PCB are located outside the orthographic projection of the driving chip on the PCB.

In an embodiment of the present disclosure, the side length of the driving chip is less than the distance between two adjacent light-emitting elements.

In an embodiment of the present disclosure, an orthographic projection of the center of the light-emitting element sub-array on the PCB coincides with an orthographic projection of a center of the driving chip on the PCB.

In an embodiment of the present disclosure, a side length of the driving chip is greater than or equal to twice the distance between two adjacent light-emitting elements, and is less than $2\sqrt{2}$ times the distance between two adjacent light-emitting elements, and N is 4; and orthographic projections of light-emitting elements in the second and third rows in the first direction and in the second and third rows in the second direction of the light-emitting element sub-array on the PCB are located within the orthographic projection of the driving chip on the PCB, and orthographic projections of remaining light-emitting elements of the light-emitting element sub-array on the PCB are located outside the orthographic projection of the driving chip on the PCB.

In an embodiment of the present disclosure, the driving chip is arranged in one manner of following: a first diagonal of the driving chip extends in the second direction, and a second diagonal of the driving chip extends in the first direction; and a first central axis of the driving chip extends in the second direction, and a second central axis extends in the first direction.

In an embodiment of the present disclosure, the side length of the driving chip is greater than or equal to twice the distance between two adjacent light-emitting elements, and is less than 3 times the distance between two adjacent light-emitting elements.

In an embodiment of the present disclosure, an orthographic projection of a center of the light-emitting element sub-array on the PCB coincides with the orthographic projection of the center of the driving chip on the PCB.

In an embodiment of the present disclosure, the side length of the driving chip ranges from 5 mm to 10 mm.

In an embodiment of the present disclosure, the side length of the driving chip is 8.8 mm.

At least one embodiment of the present disclosure provides a display device, including the light panel as described above.

According to the above-mentioned embodiment, the light-emitting element array and the driving chip are respectively located on the first surface of the PCB and the second surface of the PCB opposite to each other. The light-emitting element array includes a light-emitting element sub-array. Since projections of at least some of the light-emitting elements of the light-emitting element sub-array on the PCB are located outside the orthographic projection of the driving chip on the PCB, some light-emitting elements are not disposed directly opposite to the driving chip and are far away from the driving chip. In this way, influences of the heat generated by the light-emitting elements on the driving chip can be reduced.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, illustrate embodiments in accordance with the disclosure, and are used together with the specification to explain the principle of the disclosure.

DETAILED DESCRIPTION OF THE EMBODIMENTS

The exemplary embodiments will be described in detail here, and examples thereof are illustrated in the accompanying drawings. When the following description refers to the drawings, unless otherwise indicated, the same numbers in different drawings indicate the same or similar elements. The implementation manners described in the following exemplary embodiments do not represent all implementation manners consistent with the present disclosure. On the contrary, they are merely examples of devices and methods consistent with some aspects of the present disclosure as defined in the appended claims.

In mini LED display devices, the LED light panel includes mini LEDs arranged in an array, and the backlight driving board may include at least one driving chip including a driving circuit for the mini LED. In the technology known by the inventors, the following manners are adopted to reduce the influence of the heat of the LED light panel (referred to as the light panel) on the backlight driving board (referred to as the driving board).

1. In typically direct-light-type backlight circuits, a light panel and a driving board are separated, that is, global dimming, rather than local dimming, is adopted. However, in this manner, a contrast of the whole machine display is low, which cannot meet the contrast requirements of high-end displays and users.

2. In a case of a multi-dimming-zone backlight driving board, a LED light panel is driven by a backlight driving board which is arranged apart from the LED light panel. In such a manner, the backlight driving board is not interfered by heat generated by the mini LEDs. However, complexity of a wiring between the driving board and the LED light panel will be increased in this manner, and layout and simplicity of the wiring of the whole machine is seriously affected.

3. In a case that the backlight driving board and the LED light panel are arranged together and dynamic dimming is adopted, heat generated by the mimi LEDs is decreased by reducing current of the mini LEDs, so as to reduce influence of the mini LED on the driving circuit. However, in the case that the current of the mini LEDs is reduced, brightness of the whole machine is lowered, which cannot meet the higher brightness requirements.

Embodiments of the present disclosure provide a light panel and a display device, which can reduce influence of heat generated by light emitting elements on a driving chip.

At least one embodiment of the present disclosure provides a light panel, the light panel includes a printed circuit board (PCB); a light-emitting element array disposed on a first surface of the PCB and arranged in array and including a light-emitting element sub-array; and a driving chip, disposed on a second surface of PCB opposite to the first surface; an orthographic projection of at least part of the light-emitting element sub-array on the PCB is located outside of an orthographic projection of the driving chip on the PCB.

Figure 1:
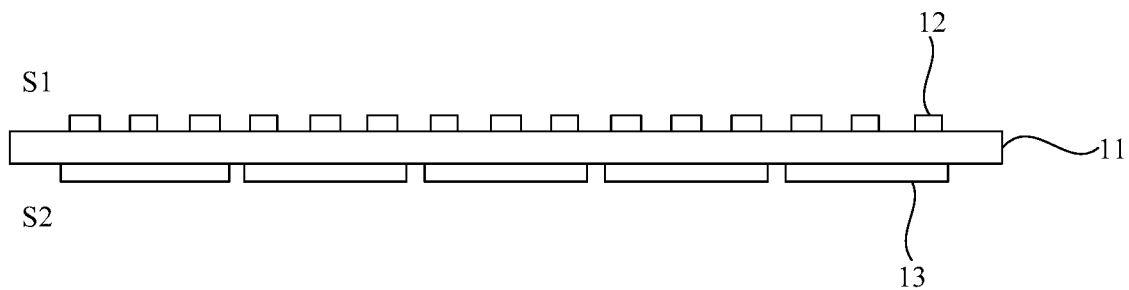
FIG. 1 illustrates a schematic structural view of a light panel according to an embodiment of the present disclosure.
Figure 2:
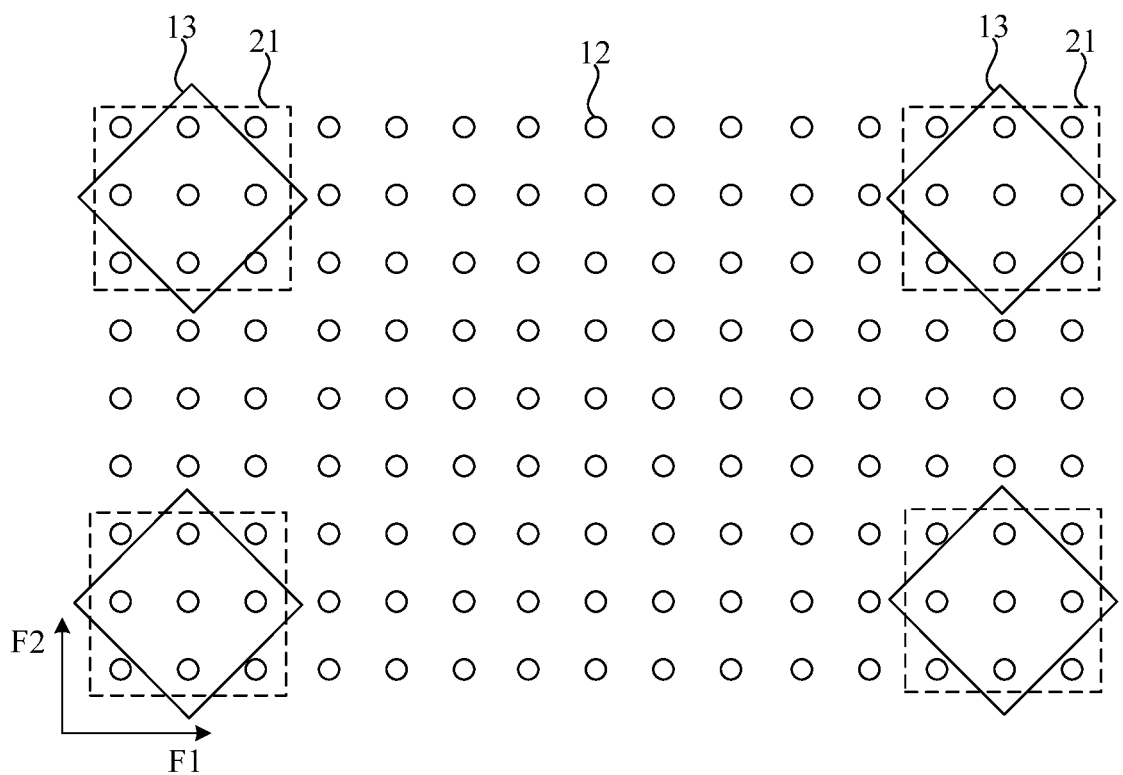
FIG. 2 illustrates a schematic view of a positional relationship between light-emitting elements and a driving chip according to an embodiment of the present disclosure.

As illustrated in FIG. 1 and FIG. 2, the light panel includes: a printed circuit board (PCB) 11, a light-emitting element array disposed on the PCB 11, light-emitting elements of the light-emitting element array arranged in a first direction F1 and a second direction F2, and a driving chip 13.

In an embodiment of the present disclosure, as illustrated in FIGS. 1 and 2, the light-emitting element array is disposed on a first surface S1 of the PCB 11, and the light-emitting element array includes a light-emitting element sub-array 21. The driving chip 13 is disposed on a second surface S2 of the PCB 11. The second surface S2 is disposed opposite to the first surface S1. An orthographic projection of at least portion of the light emitting elements 12 of the light emitting element sub-array 21 on the PCB 11 is located outside an orthographic projection of the driving chip 13 on the PCB 11.

In this embodiment, the light-emitting element array and the driving chip are respectively disposed on the first surface and the second surface opposite to the PCB. The light-emitting element array includes a light-emitting element sub-array. Since the orthographic projections of at least portion of the light-emitting elements of the light-emitting element sub-array on the PCB are located outside of the orthographic projection of the driving chip on the PCB, the at least part of the light-emitting elements are not disposed directly opposite to the driving chip, and are away from the driving chip. Thus, influence of the heat generated by the light-emitting elements on the driving chip is reduced.

The light panel according the embodiments of the present disclosure is briefly introduced above, and the light panel in the embodiment of the present disclosure is described in detail hereinafter.

At least one embodiment of the present disclosure provides a light panel. As illustrated in FIGS. 1 and 2, the light panel includes: a printed circuit board (PCB) 11, a light-emitting element array and a driving chip 13 disposed on the PCB 11.

In an embodiment of the present disclosure, as illustrated in FIGS. 1 and 2, the light emitting element array is disposed on a first surface S1 of the PCB 11, and includes a plurality of light emitting element arranged in an array in a first direction F1 and in a second direction F2. The first direction F1 and the second direction F2 are perpendicular to each other, which is not limited in the present disclosure. In the present disclosure, the first direction F1 may be referred to as a row direction, and the second direction F2 may be referred to as a column direction.

In an embodiment of the present disclosure, a distance between adjacent light emitting elements 12 in the first direction F1 or the second direction F2 is the same. For example, a distance between the light emitting element 12 located in the first row and in the first column and the light emitting element 12 located in the first row and in the second column is the same as a distance between the light emitting elements 12 located in the first row and in the second column and the light emitting element 12 located in the first row and in the third column. For another example, a distance between the light emitting element 12 located in the first row and in the first column and the light emitting elements 12 located in the second row and in the first column and a distance between the light emitting elements 12 located in the second row and in the first column and the light-emitting element located the third row and the first column are the same. For still another example, a distance between the light-emitting element 12 located in the first row and in the first column and the light-emitting elements 12 located in the first row and in the second column is the same as a distance between the light-emitting element 12 located in the first row and in the first column and light-emitting element 12 located the second row and in the first column. Assuming that the distance between two adjacent light-emitting elements 12 can be referred to as a lamp pitch, a lamp pitch in the first direction F1 and a lamp pitch in the second direction F2 is substantially the same.

In an embodiment of the present disclosure, the light-emitting element array includes a light-emitting element sub-array 21. The light-emitting element sub-array 21 is an array formed by a portion of the light-emitting elements 12 of the light-emitting element array, and a distance between adjacent light-emitting elements 12 of the light-emitting element sub-array 21 is the same as a distance between adjacent light-emitting elements of the light-emitting element array. The number of light-emitting elements 12 of the light-emitting element sub-array 21 is less than the total number of light-emitting elements 12 of the light-emitting element array.

It should be noted that the light-emitting element sub-array 21 is virtually divided from the light-emitting element array, and the distance between adjacent light-emitting elements 12 of the light-emitting element sub-array 21 is the same as the distance between adjacent light-emitting elements 12 of the light-emitting element array. An orthographic projection of a center of the light-emitting element sub-array 21 on the PCB 11 is located within an orthographic projection of the driving chip 13 on the PCB 11.

It should be noted that the number of light-emitting element sub-arrays 21 and the number of driving chips 13 may both be M, and M is a positive integer. In a case that M is 1, orthographic projection of at least portions of the light-emitting elements of the light-emitting element sub-array 21 on the PCB 11 are located outside an orthographic projection of the driving chip 13 on the PCB 11. In a case that M is greater than or equal to 2, the light-emitting element sub-array 21 corresponds to the driving chip 13 respectively. For each light-emitting element sub-array 21, orthographic projections of at least portion of the light-emitting elements of the light-emitting element sub-array 21 on the PCB 11 are located outside of an orthographic projection of a corresponding driving chip 13 on the PCB 11.

In an embodiment of the present disclosure, there may be a plurality of the light-emitting element sub-arrays 21. Each light-emitting element sub-array 21 includes N*N light-emitting elements 12, and the number of light-emitting elements 12 of each light-emitting element sub-array 21 arranged in the first direction F1 is N and the number of light-emitting elements 12 of each light-emitting element sub-array 21 arranged in the second direction F2 is also N.

In an embodiment of the present disclosure, N is 3, which is not limited in the present disclosure.

In an embodiment of the present disclosure, a distance between two adjacent light-emitting elements 12 ranges from 2.5 mm to 5 mm. For example, the distance between two adjacent light emitting elements 12 may be 2.5 mm, 3.7 mm, or 5 mm.

In an embodiment of the present disclosure, as illustrated in FIGS. 1 to 2, there may be a plurality of driving chips 13. The plurality of driving chips 13 are disposed on a second surface S2 of the PCB 11, and may be arranged in an array in the first direction F1 and in the second direction F2, which is not limited in the present disclosure. The second surface S2 is disposed opposite to the first surface S1. As described above, the plurality of driving chips 13 correspond to the plurality of light-emitting element sub-arrays 21 respectively.

In an embodiment of the present disclosure, the driving chip 13 has a square shape. That is, the driving chip 13 has a square shape, and four side lengths of the driving chip 13 are equal. A side length of the driving chip 13 ranges from 5 mm to 10 mm. For example, a side length of the driving chip 13 is 5 mm, 7.5 mm, or 10 mm.

In an embodiment of the present disclosure, as illustrated in FIG. 2, the side length of the driving chip 13 is twice the distance between two adjacent light-emitting elements 12. It should be noted that in a case that a ratio of the side length of the driving chip 13 to the distance between two adjacent light-emitting elements 12 is within a preset range, it can be regarded that the side length of the driving chip 13 is twice the distance between the two adjacent light-emitting elements 12, for example, the preset range is 1.9~2.1, which is not limited in the preset disclosure. For another example, in a case that the distance between two adjacent light-emitting elements 12 is 4.3 mm and the side length of the driving chip 13 is 8.8 mm, the ratio of 8.8 mm to 4.3 mm is 2.05, and 2.05 is within the preset range of 1.9~2.1, thus, it can be regarded as that the side length of the driving chip 13 is twice the distance between two adjacent light-emitting elements 12.

Figure 3:
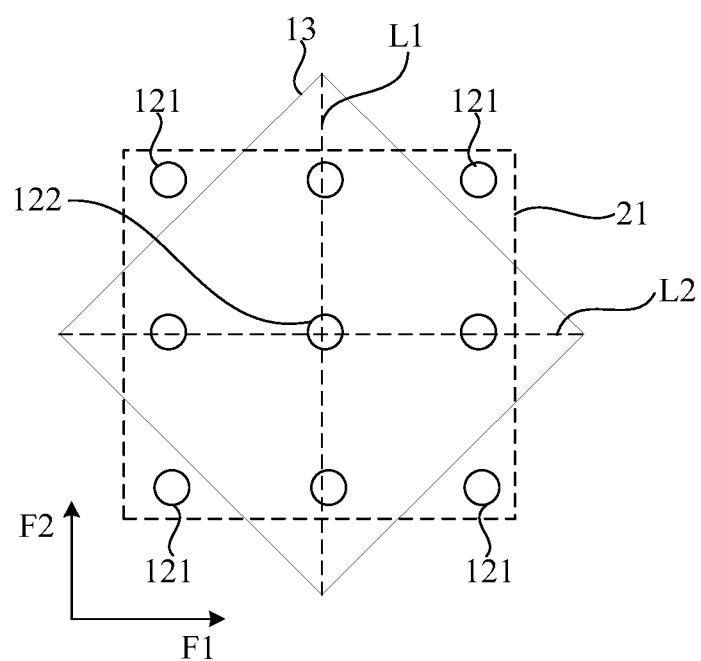
FIG. 3 illustrates a schematic view of a positional relationship between light-emitting elements and a driving chip according to another embodiment of the present disclosure.

In an embodiment of the present disclosure, as illustrated in FIG. 3, for each light-emitting element sub-array 21, an orthographic projection of a light-emitting element 121 at the vertex on the PCB 11 is located outside of an orthographic projection of a corresponding driving chip 13 on the PCB 11. In addition to this, an orthographic projection of a light-emitting element 122 at the center point on the PCB is located within the orthographic projection of the corresponding driving chip 13 on the PCB 11.

Since a Mini LED can be regarded as a heat source during generating heat, a relationship between the heat generated by the Mini LED and the distance is $$Q = Q_0 \times \frac{1}{r^2} \times k;$$

where, Q is heat at a position at a distance r from the Mini LED, $Q_0$ is the heat at the position of the Mini LED, k is a coefficient, a value of which can be derived based on experience, experiment or theory.

It can be seen from the above formula that the farther a position away from the Mini LED, the less interference of the heat generated by the Mini LED. Therefore, in a case that the light emitting element 121 at the apex is not located directly opposite to the driving chip 13, and the influence of the heat generated by the light emitting element located at the apex to the driving chip can be reduced.

In an embodiment of the present disclosure, as illustrated in FIG. 3, for each light emitting element sub-array 21, orthographic projections of the second row of light emitting elements 12 in the first direction F1 on the PCB 11 are located on an orthographic projection of a diagonal line L1 of a corresponding driving chip on the PCB 11, and orthographic projections of the second row of light-emitting elements 12 in the second direction F2 on the PCB 11 are located on an orthographic projection of another diagonal of the corresponding driving chip 13 on the PCB 11. In this way, orthographic projections of at least two apexes of the driving chip 13 on the PCB 11 and the orthographic projections of the light-emitting elements on the PCB 11 do not overlap, so the influence of the heat generated by the light-emitting element to the driving chip can be reduced.

It should be noted that the orthographic projection of the second row of light-emitting elements located in the first direction F1 on the PCB 11 being located on the orthographic projection of a diagonal line L1 of the corresponding driving chip 13 on the PCB 11, includes the following situations: 1. the orthographic projection of the second row of light-emitting elements located in the first direction F1 on the PCB 11 completely coincides with the orthographic projection of the diagonal line L1 of the corresponding driving chip 13 on the PCB 11; 2. the orthographic projection of the second row of light-emitting elements located in the first direction F1 on the PCB 11 partially coincide with the orthographic projection of the diagonal line L1 of the corresponding driving chip 13 on the PCB 11; and 3. a distance between the orthographic projection of the second row of light-emitting elements located in the first direction F1 on the PCB 11 between the orthographic projection of the diagonal line L1 of a corresponding driving chip 13 on the PCB 11 a preset range.

In an embodiment of the present disclosure, as illustrated in FIG. 3, for each light-emitting element sub-array 21, an orthographic projection of the light-emitting element 122 at the center on the PCB 11 and an orthographic projection of the center of the corresponding driving chip 13 on the PCB 11 coincide with each other. In this way, an orthographic projections of the four vertex corners of the driving chip 13 on the PCB 11 and an orthographic projection of the light-emitting elements on the PCB 11 do not overlap, thus, the influence of the heat generated by the light-emitting elements on the driving chip can be reduced, and the driving chip is heated evenly, which can avoid local overheating.

It should be noted that in a case that the orthographic projection of the light-emitting element 122 at the center on the PCB 11 and the orthographic projection of the center of the corresponding driving chip 13 on the PCB 11 coincide, an orthographic projection of the second row of light-emitting elements in the first direction F1 on the PCB 11 may be not located on the orthographic projection of the diagonal line L1 of the corresponding driving chip 13 on the PCB 11, and an orthographic projection of the second row of light-emitting elements in the second direction F2 may also not located on an orthographic projection of another diagonal line L2 of the corresponding driving chip 13 on the PCB 11. In other words, in a case that the orthographic projection of the light-emitting element 122 at the center on the PCB 11 and the orthographic projection of the center of the corresponding driving chip 13 on the PCB 11 coincide, an angle included between the a diagonal line L1 of the driving chip 13 and the first direction F1 is an acute or obtuse angle.

Figure 4:
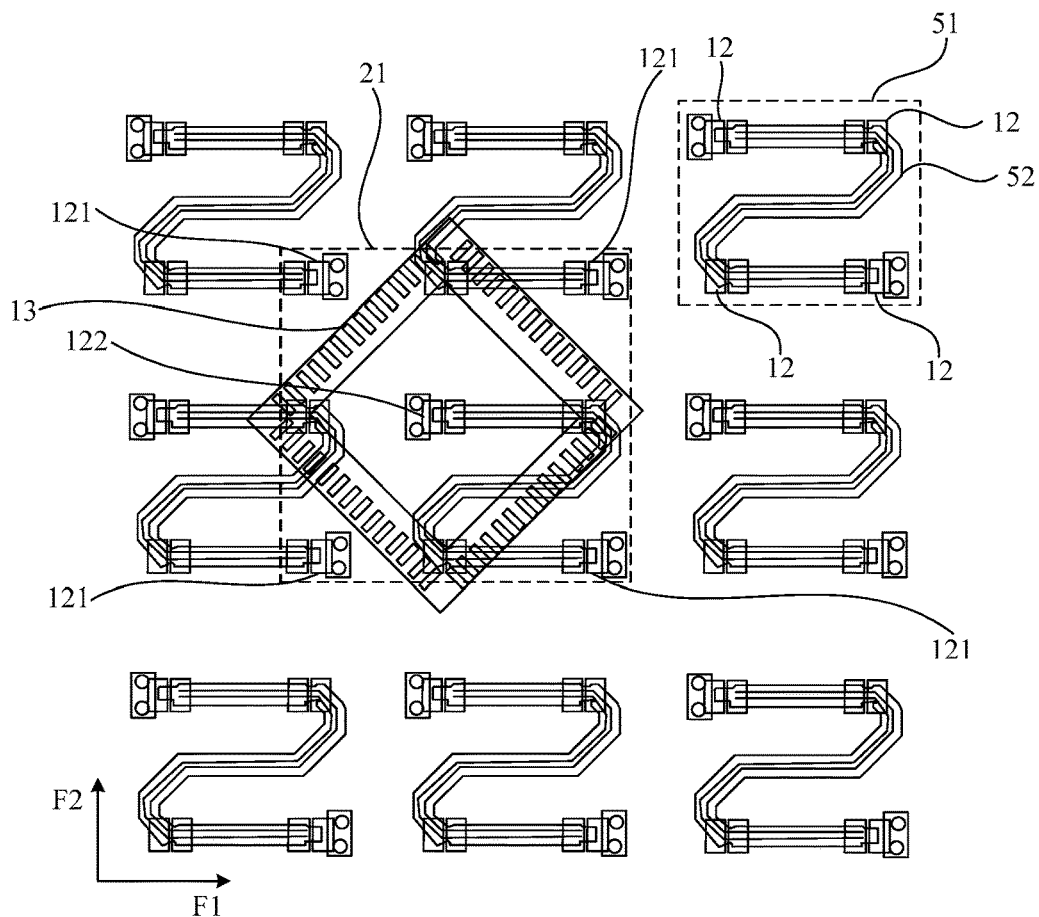
FIG. 4 illustrates a schematic view of a positional relationship between light-emitting elements and a driving chip according to another embodiment of the present disclosure.

In actual application, as illustrated in FIG. 4, the light-emitting element array may include 20,736 dimming zones 51 arranged in an array. Each dimming zone 51 includes four light-emitting elements 12 arranged in an array. Four light-emitting elements 12 of a dimming zone 51 can be connected by a wire 52. A total of 82,944 light-emitting elements 12 are arranged on the light panel, and a distance between two adjacent light-emitting elements 12 is 4.3 mm. The light emitting element 12 is a Mini LED. The light panel may include 8 light-emitting element sub-arrays 21 and 8 driving chips 13. The eight light-emitting element sub-arrays 21 correspond to the eight driving chips 13 respectively. Each light-emitting element sub-array 21 includes nine light-emitting elements 12, and the nine light-emitting elements 12 are respectively located in four adjacent dimming zones 51. One driving chip 13 can drive light-emitting elements 12 in one or more dimming zones 51. A side length of the driving chip 13 is 8.8 mm. In this light panel, a large number of Mini LEDs are used, which can make heat distribution of the light panel relatively uniform, and higher brightness, higher contrast, and local dimming can be achieved.

As illustrated in FIG. 4, the light-emitting elements 12 and the driving chip 13 are disposed in the layout as illustrated in FIG. 3: a side length of the driving chip 13 is twice a distance between two adjacent light-emitting elements 12, and for each light-emitting element sub-array 21, orthographic projections of light-emitting elements 121 at the vertexes on the PCB 11 are located outside an orthographic projection of the corresponding driving chip 13 on the PCB 11, and an orthographic projection of a light-emitting element 122 at the center on the PCB 11 is located within the orthographic projection of the corresponding driving chip 13 on the PCB 11, an orthographic projection of a second row of light-emitting elements 12 in the first direction F1 on the PCB 11 is located on an orthographic projection of a diagonal line of the corresponding driving chip 13 on the PCB 11, an orthographic projection of the second row of light-emitting elements 12 in the second direction F2 on the PCB 11 is located on an orthographic projection of another diagonal of the corresponding driving chip 13 on the PCB 11, and an orthographic projection of light-emitting element at the center coincide with an orthographic projection of the center of the corresponding driving chip 13 on the PCB 11.

In this way, the orthographic projections of the four light-emitting elements 121 at the vertexes on the PCB 11 are located outside the orthographic projection of the corresponding driving chip 13 on the PCB 11, and the orthographic projections of four vertexes of the driving chip 13 on the PCB 11 do not coincide with the orthographic projections of the light-emitting elements on the PCB 11. Thus, the influence of the heat generated by the light-emitting elements on the driving chip can be reduced.

In an embodiment of the present disclosure, the driving chip may be placed at a position where a heat superposition value is small, so as to reduce the influence of the light-emitting element on the driving chip.

Figure 5:
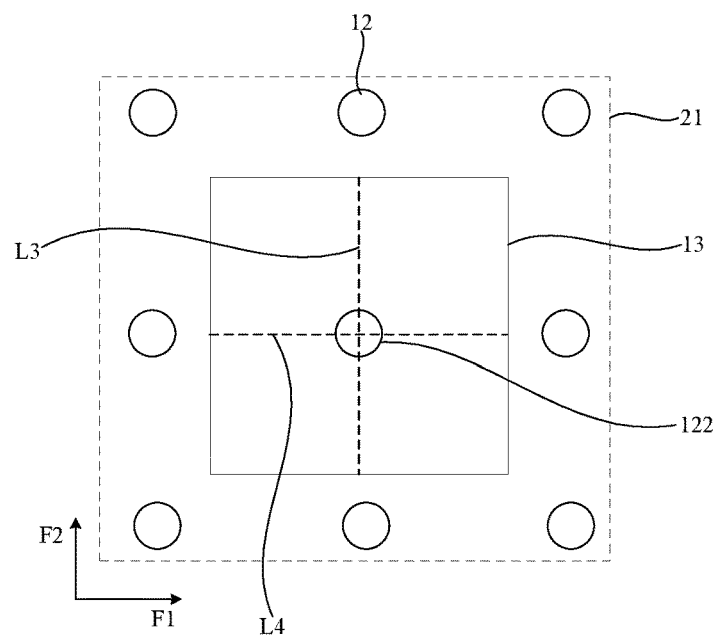
FIG. 5 illustrates a schematic view of a positional relationship between light-emitting elements and a driving chip according to another embodiment of the present disclosure.

Moreover, in the embodiment of the present disclosure, the driving chip and the light-emitting elements are integrated, that is, the backlight LEDs and the driving chip are both arranged on the light panel, which can effectively reduce the entire thickness of the machine In an embodiment of the present disclosure, as illustrated in FIG. 5, N is 3. Each light-emitting element sub-array 21 includes light-emitting elements 12 in three rows and three columns. The difference from the embodiment illustrated in FIG. 3 lies in that in this embodiment, a side length of the driving chip 13 is greater than 1.2 times the distance between two adjacent light-emitting elements 12, and is less than twice the distance between two adjacent light-emitting elements 12.

It should be noted that in some embodiments of the present disclosure, a side length of the driving chip 13 may also be greater than $\sqrt{2}$ times the distance between two adjacent light-emitting elements 12. In other words, a length of the diagonal line of the driving chip 13 is greater than twice the distance between two adjacent light-emitting elements 12. In some embodiments of the present disclosure, alternatively, a side length of the driving chip 13 may be equal to $\sqrt{2}$ times the distance between two adjacent light-emitting elements 12. In other words, a length of the diagonal of the driving chip 13 is equal to twice the distance between two adjacent light-emitting elements 12.

In an embodiment of the present disclosure, the distance between two adjacent light-emitting elements ranges from 3.5 mm to 7 mm, for example, the distance between two adjacent light-emitting elements may be 3.5 mm, 5.2 mm, or 7 mm.

In an embodiment of the present disclosure, the distance between two adjacent light-emitting elements is 5 mm, and the side length of the driver chip is 7.5 mm.

As illustrated in FIG. 5, in an embodiment of the present disclosure, for each light-emitting element sub-array 21, only the orthographic projection of the light-emitting element 122 at the center of the light-emitting element sub-array 21 on the PCB 11 is located in the orthographic projection of the corresponding driving chip 13 on the PCB. And orthographic projections of remaining light-emitting elements 12 on the PCB 11 are all located outside of the orthographic projection of the corresponding driving chip 13 on the PCB 11. In this way, thermal interference of most of the light emitting elements 12 of each light emitting element sub-array 21 to the driving chip can be reduced.

In an embodiment of the present disclosure, as illustrated in FIG. 5, for each light-emitting element sub-array 21, an orthographic projection of the second row of light-emitting elements 12 in the first direction F1 on the PCB 11 is located on an orthographic projection of a central axis line L3 of a corresponding driving chip 13 on the PCB 11, an orthographic projection of the second row of light-emitting elements 12 in the second direction F2 on the PCB 11 is located on an orthographic projection of another central axis line L4 of the corresponding driving chip 13 on the PCB 11, and an orthographic projection of an light-emitting element at a center on the PCB 11 coincides with an orthographic projection of a center of the corresponding driving chip 13 on the PCB 11. The central axis L4 extends in the first direction F1, and the central axis L3 extends in the second direction F2. In this way, the thermal interference to the driver chip can be evenly distributed, and local overheating can be avoided.

Figure 6:
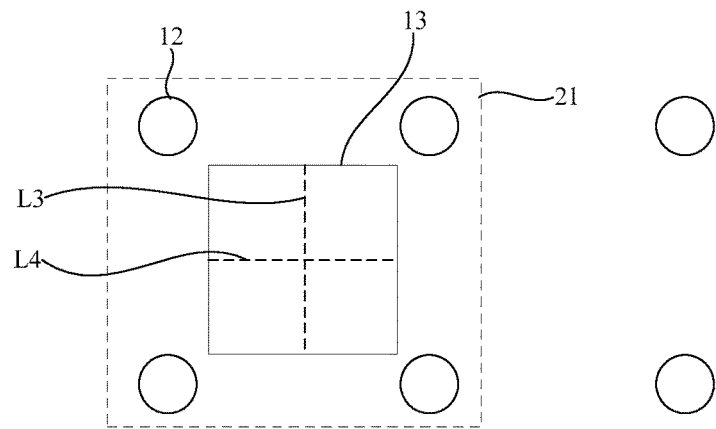
FIG. 6 illustrates a schematic view of a positional relationship between light-emitting elements and a driving chip according to another embodiment of the present disclosure.

In an embodiment of the present disclosure, as illustrated in FIG. 6, N is 2. Each light-emitting element sub-array 21 includes light-emitting elements 12 in two rows and in two columns. A side length of the driving chip 13 is less than or equal to 1.15 times a distance between two adjacent light-emitting elements 12.

It should be noted that in some embodiments of the present disclosure, alternatively, the side length of the driving chip 13 may be less than the distance between two adjacent light-emitting elements 12.

In some embodiments of the present disclosure, the distance between two adjacent light-emitting elements 12 ranges from 7 mm to 14 mm. For example, the distance between two adjacent light emitting elements 12 may be 7 mm, 10.5 mm, or 14 mm.

In an embodiment of the present disclosure, the distance between two adjacent light emitting elements 12 may be 11.3 millimeters and the side length of the driving chip 13 is 8.8 mm.

In an embodiment of the present disclosure, as illustrated in FIG. 6, for each light-emitting element sub-array 21, orthographic projections of all the light-emitting elements 12 of the light-emitting element sub-array on the PCB 11 are located outside an orthographic projection of a corresponding driving chip 13 on the PCB 11. In this way, the thermal interference of the light emitting element 12 to the driving chip 13 can be greatly reduced.

In an embodiment of the present disclosure, as illustrated in FIG. 6, for each light-emitting element sub-array 21, a central axis L4 of the corresponding driving chip 13 extends in the first direction F1, and another central axis L3 extends in the second direction F2.

In an embodiment of the present disclosure, as illustrated in FIG. 6, for each light-emitting element sub-array 21, an orthographic projection of a center of the light-emitting element sub-array 21 on the PCB 11 coincides with an orthographic projection of a center of the corresponding driving chip 13 on the PCB. In this way, the thermal interference to the driver chip can be evenly distributed, and local overheating can be avoided.

Figure 7:
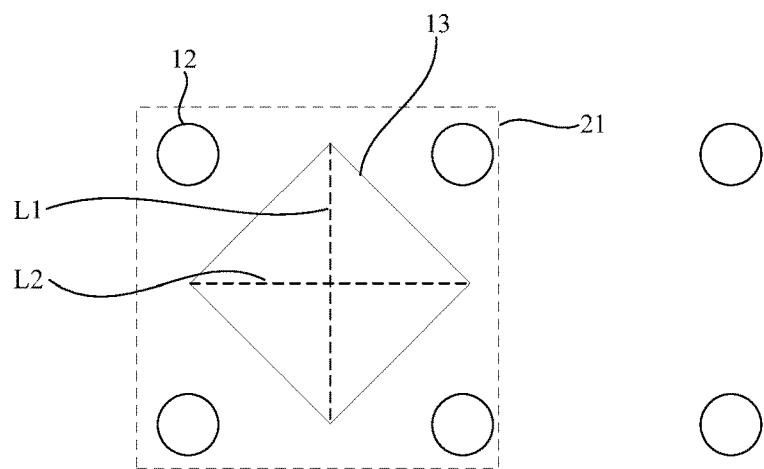
FIG. 7 illustrates a schematic view of a positional relationship between light-emitting elements and a driving chip according to another embodiment of the present disclosure.

In an embodiment of the present disclosure, as illustrated in FIG. 7, for each light-emitting element sub-array 21, a diagonal line L2 of the corresponding driving chip 13 extends in the first direction F1, and another diagonal line L1 extends in the second direction F2. An orthographic projection of the center of the light-emitting element sub-array 21 on the PCB 11 coincides with an orthographic projection of the center of the corresponding driving chip 13 on the PCB 11.

In an embodiment of the present disclosure, a side length of the driving chip 13 is less than 1.15 times a distance between two adjacent light-emitting elements. Of course, alternatively, the side length of the driving chip 13 can be equal to 1.15 times the distance between two adjacent light-emitting elements.

In an embodiment of the present disclosure, as illustrated in FIG. 7, a length of the diagonal line L1 of the driving chip 13 is equal to a distance between two adjacent light-emitting elements.

It should be noted that, alternatively, the length of the diagonal line L1 of the driving chip 13 may be less than the distance between two adjacent light-emitting elements 12.

Figure 8:
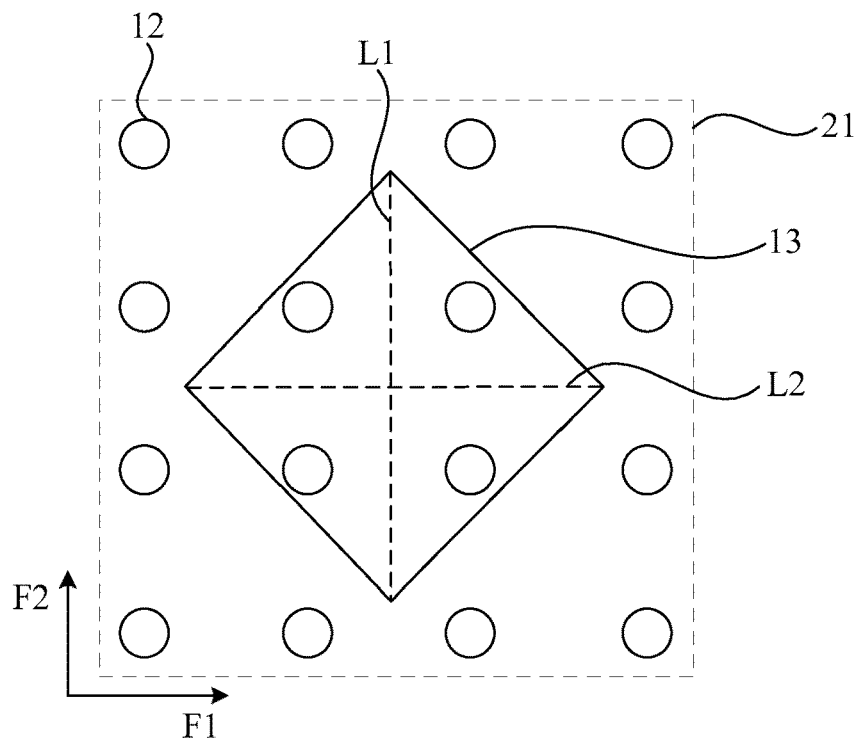
FIG. 8 illustrates a schematic view of a positional relationship between light-emitting elements and a driving chip according to another embodiment of the present disclosure.

In an embodiment of the present disclosure, as illustrated in FIG. 8, N is 4.

In an embodiment of the present disclosure, as illustrated in FIG. 8, in each light-emitting element sub-array 21, orthographic projections of the second row and the third row of light-emitting elements in the first direction F1, and the second row and the third row of light-emitting elements in the second direction F2 on the PCB 11 are located within an orthographic projection of the driving chip 13 on the PCB 1, and orthographic projections of remain light emitting elements of the light-emitting element sub-array on the PCB 11 are located outside the orthographic projection of the driving chip 13 on the PCB 11. 1 That is, in each light-emitting element sub-array 21, the orthographic projections of the light-emitting elements 12 located in the second row, the third row, and in the second column and the third column on the PCB 11 are located within the orthographic projection of the driving chip 13 on the PCB 11, and the orthographic projections of remaining light-emitting elements on the PCB 11 are located outside the orthographic projection of the driving chip 13 on the PCB 11.

In an embodiment of the present disclosure, as illustrated in FIG. 8, a diagonal line L2 of the driving chip 13 extends in the first direction F1, and another diagonal line L1 extends in the second direction F2. Moreover, the orthographic projection of the center of the light emitting element sub-array 21 on the PCB 11 coincides with the orthographic projection of the center of the driving chip 13 on the PCB 11.

In an embodiment of the present disclosure, a side length of the driving chip 13 is greater than twice the distance between two adjacent light-emitting elements 12 and less than $2\sqrt{2}$ times the distance between two adjacent light-emitting elements 12. Of course, the side length of the driving chip 13 can also be equal to twice the distance between two adjacent light-emitting elements 12.

In an embodiment of the present disclosure, the orthographic projections of most of the light-emitting elements of each light-emitting element sub-array on the PCB are located outside the orthographic projection of the driving chip on the PCB. In this way, the thermal interference of the light-emitting elements to the driving chip can be reduced.

Figure 9:
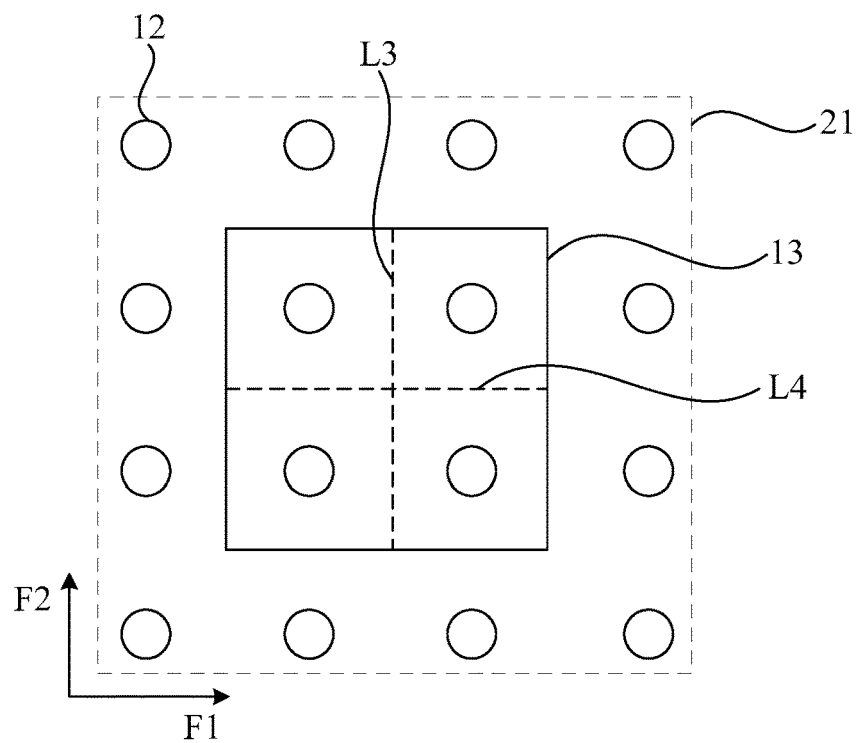
FIG. 9 illustrates a schematic view of a positional relationship between light-emitting elements and a driving chip according to another embodiment of the present disclosure.

In an embodiment of the present disclosure, as illustrated in FIG. 9, the difference from the embodiment as illustrated in FIG. 8 lies in that a central axis L4 of the driving chip 13 extends in the first direction F1, and another central axis L3 extends in the second direction F2.

In an embodiment of the present disclosure, the side length of the driving chip 13 is greater than twice the distance between two adjacent light-emitting elements 12 and less than 3 times the distance between two adjacent light-emitting elements 12. In some embodiments, the side length of the driving chip 13 is less than $2\sqrt{2}$ times the distance between two adjacent light-emitting elements 12. Of course, alternatively, the side length of the driving chip 13 may be equal to twice the distance between two adjacent light-emitting elements 12.

In an embodiment of the present disclosure, the orthographic projection of most of the light-emitting elements of each light-emitting element sub-array on the PCB are located outside the orthographic projection of the driving chip on the PCB. In this way, the thermal interference of the light-emitting elements to the driving chip can be reduced. Moreover, compared with the embodiment as illustrated in FIG. 8, in the embodiment as illustrated in FIG. 9, the thermal interference of the light emitting element to the driving chip can be further reduced.

At least one embodiment of the present disclosure further provides a display device, including a display module, and further including the light panel described in any of the above embodiments.

In an embodiment of the present disclosure, the light-emitting element array and the driving chip are respectively disposed on a first surface and a second surface opposite to the PCB, and the light-emitting element array includes a light-emitting element sub-array, as the orthographic projections of at least portion of the light-emitting elements of the light-emitting element sub-array on the PCB is located outside the orthographic projection of the corresponding driving chip on the PCB, some light-emitting elements are not disposed directly opposite to the driving chip and are far away from the driving chip, thus, influence of heat generated by the light-emitting elements on the driving chip can be reduced.

It should be noted that the display device in this embodiment may be any product or component with display function, such as electronic paper, a mobile phone, a tablet computer, a television, a notebook computer, a digital photo frame, a navigator, and etc.

It should be pointed out that in the drawings, the sizes of layers and regions may be exaggerated for clarity of illustration. It should further be understood that in a case that an element or layer is referred to as being "on" another element or layer, it can be directly on the other element or an intervening layer may be present. In addition, it will be understood that in a case that an element or layer is referred to as being "under" another element or layer, it can be directly under the other element, or there may be at least one intervening layer or element. In addition, it should further be understood that in a case that a layer or element is referred to as being "between" two layers or two elements, it can be the only layer or element between the two layers or two elements, or at least one intervening layer or component may further be present. Similar reference signs indicate similar elements throughout the specification.

In the present disclosure, the terms "first" and "second" are only used for descriptive purposes, and cannot be understood as indicating or implying relative importance. The term "plurality" refers to two or more than two, unless specifically defined otherwise.

One ordinary skill in the art will easily think of other embodiments of the present disclosure after considering the specification and practicing the disclosure disclosed herein. The present disclosure is intended to cover any variations, applications, or modifications of the present disclosure. These variations, applications, or modifications follow the general principles of the present disclosure and include common knowledge or conventional technical means in the technical field that are not disclosed in the present disclosure. The description and the embodiments are to be regarded as exemplary only, and the true scope and spirit of the present disclosure are limited by the appended claims.

The invention claimed is:

1. A light panel, comprising:
a printed circuit board (PCB);
a light emitting element array, comprising a plurality of light emitting elements disposed on a first surface of the PCB and arranged in an array in a first direction and in a second direction; and
a driving chip, disposed on a second surface of the PCB, which is opposite to the first surface;
wherein the light-emitting element array comprises a light-emitting element sub-array, and orthographic projections of at least portion of light-emitting elements of the light-emitting element sub-array on the PCB are located outside an orthographic projection of the driving chip on the PCB;
wherein the light-emitting element sub-array comprises N*N light-emitting elements among the plurality of light-emitting elements, and both the numbers of light-emitting elements of the light-emitting element sub-array arranged in the first direction and in the second direction are N, and a distance between two adjacent light-emitting elements of the light-emitting element sub-array and a distance between two adjacent light-emitting elements of the light-emitting element array are same; and
the driving chip has a square shape;
wherein a side length of the driving chip is twice the distance between two adjacent light-emitting elements, and N is 3;
an orthographic projection of a light-emitting element at a vertex of the light-emitting element sub-array on the PCB is located outside an orthographic projection of the driving chip on the PCB; and
an orthographic projection of a light-emitting element at a center of the light-emitting element sub-array on the PCB is located within the orthographic projection of the driving chip on the PCB.

2. The light panel according to claim 1, wherein the distance between two adjacent light-emitting elements ranges from 2.5 mm to 5 mm.

3. The light panel according to claim 1, wherein orthographic projections of the light-emitting elements of the light-emitting element sub-array on the PCB and orthographic projections of diagonal lines of the driving chip on the PCB satisfy at least one of following:
orthographic projections of light emitting elements in a second row in the first direction on the PCB are located on an orthographic projection of a first diagonal line of the driving chip on the PCB, and the first diagonal line extends in the second direction; and
orthographic projections of light-emitting elements in a second row in the second direction on the PCB are located on an orthographic projection of a second diagonal line of the driving chip on the PCB, and the second diagonal line extends in the first direction.

4. The light panel according to claim 1, wherein the orthographic projection of the light-emitting element at the center of the light-emitting element sub-array on the PCB coincides with an orthographic projection of a center of the driving chip on the PCB.

5. A display device, comprising the light panel according to claim 1.

6. A light panel, comprising:
a printed circuit board (PCB);
a light emitting element array, comprising a plurality of light emitting elements disposed on a first surface of the PCB and arranged in an array in a first direction and in a second direction; and
a driving chip, disposed on a second surface of the PCB, which is opposite to the first surface;
wherein the light-emitting element array comprises a light-emitting element sub-array, and orthographic projections of at least portion of light-emitting elements of the light-emitting element sub-array on the PCB are located outside an orthographic projection of the driving chip on the PCB;
wherein the light-emitting element sub-array comprises N*N light-emitting elements among the plurality of light-emitting elements, and both the numbers of light-emitting elements of the light-emitting element sub-array arranged in the first direction and in the second direction are N, and a distance between two adjacent light-emitting elements of the light-emitting element sub-array and a distance between two adjacent light-emitting elements of the light-emitting element array are same; and
the driving chip has a square shape;
a side length of the driving chip is greater than 1.2 times the distance between two adjacent light-emitting elements and is less than twice the distance between two adjacent light-emitting elements, N is 3; and
only an orthographic projection of a light-emitting element at a center of the light-emitting element sub-array on the PCB is located within the orthographic projection of the driving chip on the PCB.

7. The light panel according to claim 6, wherein orthographic projections of the light-emitting elements of the light-emitting element sub-array on the PCB and orthographic projections of central axes of the driving chip on the PCB satisfy at least one of following:
orthographic projections of a second row of light emitting elements in the first direction on the PCB are located on an orthographic projection of a first central axis of the driving chip on the PCB, and the first central axis extends in the second direction; and
orthographic projections of a second row of light-emitting elements in the second direction on the PCB are located on an orthographic projection of a second central axis of the driving chip on the PCB, and the second central axis extends in the first direction.

8. The light panel according to claim 6, wherein, the orthographic projection of the light-emitting element at the center of the light-emitting element sub-array on the PCB coincides with an orthographic projection of a center of the driving chip on the PCB.

9. The light panel according to claim 6, wherein the distance between two adjacent light-emitting elements ranges from 3.5 mm to 7 mm.

10. A display device, comprising the light panel according to claim 6.

11. A light panel, comprising:
a printed circuit board (PCB);
a light emitting element array, comprising a plurality of light emitting elements disposed on a first surface of the PCB and arranged in an array in a first direction and in a second direction; and
a driving chip, disposed on a second surface of the PCB, which is opposite to the first surface;
wherein the light-emitting element array comprises a light-emitting element sub-array, and orthographic projections of at least portion of light-emitting elements of the light-emitting element sub-array on the PCB are located outside an orthographic projection of the driving chip on the PCB;
wherein the light-emitting element sub-array comprises N*N light-emitting elements among the plurality of light-emitting elements, and both the numbers of light-emitting elements of the light-emitting element sub-array arranged in the first direction and in the second direction are N, and a distance between two adjacent light-emitting elements of the light-emitting element sub-array and a distance between two adjacent light-emitting elements of the light-emitting element array are same; and
the driving chip has a square shape;
wherein a side length of the driving chip is less than or equal to 1.15 times the distance between two adjacent light-emitting elements, N is 2; and
orthographic projections of all the light-emitting elements of the light-emitting element sub-array on the PCB are located outside the orthographic projection of the driving chip on the PCB.

12. The light panel according to claim 11, wherein the side length of the driving chip is less than the distance between two adjacent light-emitting elements.

13. The light panel according to claim 11, wherein an orthographic projection of a center of the light-emitting element sub-array on the PCB coincides with an orthographic projection of a center of the driving chip on the PCB.

14. The light panel according to claim 11, wherein the distance between two adjacent light-emitting elements ranges from 7 mm to 14 mm.

15. A display device, comprising the light panel according to claim 11.

16. A light panel, comprising:
a printed circuit board (PCB);
a light emitting element array, comprising a plurality of light emitting elements disposed on a first surface of the PCB and arranged in an array in a first direction and in a second direction; and
a driving chip, disposed on a second surface of the PCB, which is opposite to the first surface;
wherein the light-emitting element array comprises a light-emitting element sub-array, and orthographic projections of at least portion of light-emitting elements of the light-emitting element sub-array on the PCB are located outside an orthographic projection of the driving chip on the PCB;
wherein the light-emitting element sub-array comprises N*N light-emitting elements among the plurality of light-emitting elements, and both the numbers of light-emitting elements of the light-emitting element sub-array arranged in the first direction and in the second direction are N, and a distance between two adjacent light-emitting elements of the light-emitting element sub-array and a distance between two adjacent light-emitting elements of the light-emitting element array are same; and
the driving chip has a square shape;
wherein a side length of the driving chip is greater than or equal to twice the distance between two adjacent light-emitting elements, and is less than three times the distance between two adjacent light-emitting elements, and N is 4; and
orthographic projections of light-emitting elements in second and third rows in the first direction and in second and third rows in the second direction of the light-emitting element sub-array on the PCB are located within the orthographic projection of the driving chip on the PCB, and orthographic projections of remaining light-emitting elements of the light-emitting element sub-array on the PCB are located outside the orthographic projection of the driving chip on the PCB.

17. The light panel according to claim 16, wherein
a first central axis of the driving chip extends in the second direction, and a second central axis of the driving chip extends in the first direction.

18. The light panel according to claim 16, wherein a first diagonal of the driving chip extends in the second direction, and a second diagonal of the driving chip extends in the first direction and the side length of the driving chip is greater than or equal to twice the distance between two adjacent light-emitting elements, and is less than $2\sqrt{2}$ times the distance between two adjacent light-emitting elements.

19. The light panel according to claim 16, wherein an orthographic projection of a center of the light-emitting element sub-array on the PCB coincides with an orthographic projection of a center of the driving chip on the PCB.

20. A display device, comprising the light panel according to claim 16.

* * * * *